US008009396B2

(12) United States Patent
Bernard et al.

(10) Patent No.: US 8,009,396 B2
(45) Date of Patent: Aug. 30, 2011

(54) METHOD AND APPARATUS FOR ESD PROTECTION

(75) Inventors: David Bernard, Aix-en-Provence (FR); Jean-Jacques Kazazian, Pourcieux (FR); Antoine Riviere, Pourcieux (FR)

(73) Assignee: Atmel Rousset S.A.S., Rousset (FR)

( * ) Notice: Subject to any disclaimer, the term of this patent is extended or adjusted under 35 U.S.C. 154(b) by 651 days.

(21) Appl. No.: 12/030,401

(22) Filed: Feb. 13, 2008

(65) Prior Publication Data

US 2009/0201615 A1    Aug. 13, 2009

(51) Int. Cl.
*H02H 3/22* (2006.01)
(52) U.S. Cl. .................................. 361/56; 361/111
(58) Field of Classification Search .................. 361/56, 361/111
See application file for complete search history.

(56) References Cited

U.S. PATENT DOCUMENTS

| | | | |
|---|---|---|---|
| 5,946,177 A | 8/1999 | Miller et al. | |
| 5,978,192 A * | 11/1999 | Young et al. | 361/56 |
| 6,249,410 B1 | 6/2001 | Ker et al. | |
| 6,621,680 B1 | 9/2003 | Segervall | |
| 6,828,766 B2 | 12/2004 | Corva et al. | |
| 6,891,495 B2 | 5/2005 | Chen et al. | |
| 6,965,503 B2 * | 11/2005 | Connor et al. | 361/56 |
| 6,972,939 B1 | 12/2005 | Ho et al. | |
| 6,989,979 B1 * | 1/2006 | Tong et al. | 361/91.1 |
| 7,027,275 B2 * | 4/2006 | Smith | 361/56 |
| 7,098,717 B2 * | 8/2006 | Watt | 327/313 |
| 7,102,862 B1 | 9/2006 | Lien et al. | |
| 7,295,411 B2 | 11/2007 | Arai et al. | |
| 7,570,468 B2 | 8/2009 | Bernard et al. | |
| 2004/0257728 A1 | 12/2004 | Hu | |
| 2008/0007882 A1 | 1/2008 | Bernard et al. | |

FOREIGN PATENT DOCUMENTS

WO    WO-2008/005512 A2    1/2008
WO    WO-2008005512 A3    1/2008

OTHER PUBLICATIONS

"International Application Serial No. PCT/US2007/15532, International Search Report mailed May 15, 2008", 2 pgs.
"International Application Serial No. PCT/US2007/15532, Written Opinion mailed May 15, 2008", 6 pgs.
Maloney, T., et al., "Novel Clamp Circuits for IC Power Supply Protection", *IEEE Transactions on Components, Packaging, and Manufacturing Technology*, Part C, vol. 19, No. 3, (Jul. 1996), 150-161.
"U.S. Appl. No. 11/759,337, Examiner Interview Summary mailed Mar. 30, 2009", 2 pgs.
"U.S. Appl. No. 11/759,337, Final Office Action mailed Dec. 17, 2008", 10 pgs.

(Continued)

*Primary Examiner* — Stephen W Jackson
*Assistant Examiner* — Tien Mai
(74) *Attorney, Agent, or Firm* — Fish & Richardson P.C.

(57) ABSTRACT

A technique that minimizes false triggering of an electrostatic discharge (ESD) protection circuit is disclosed. In an embodiment, the resistor-capacitor (RC) time constant of an ESD trigger element is reduced during normal operation minimizing the risk of false triggering. Circuit layout area is saved without the need of a timeout circuit associated with releasing a device maintaining a trigger state (i.e., a trigger latch). A RC time constant for triggering is set in an operational context according to conditions of usage and desired application of the ESD protection circuit.

12 Claims, 3 Drawing Sheets

OTHER PUBLICATIONS

"U.S. Appl. No. 11/759,337, Non-Final Office Action mailed May 2, 2008", 15 pgs.

"U.S. Appl. No. 11/759,337, Notice of Allowance mailed Mar. 30, 2009", 9 pgs.

"U.S. Appl. No. 11/759,337, Response filed Mar. 13, 2009 to Final Office Action mailed Dec. 17, 2008", 13 pgs.

"U.S. Appl. No. 11/759,337, Response filed Aug. 29, 2008 to Non-Final Office Action mailed May 2, 2008", 13 pgs.

* cited by examiner

METHOD AND APPARATUS FOR ESD PROTECTION

CROSS REFERENCE TO APPLICATIONS

This application is related to provisional application 60/806,608 filed Jul. 5, 2006 and non-provisional application Ser. No. 11/759,337 filed Jun. 7, 2007 and these applications are hereby incorporated by reference as if fully set forth.

FIELD OF INVENTION

The present invention is related to electrostatic discharge (ESD) protection.

BACKGROUND

Electrostatic Discharge (ESD) protection is a desirable feature for integrated circuits. With a low breakdown voltage of transistors in submicron processes it is important to protect power supply pins and pads from ESD damage, especially on smaller integrated circuits where there is no high capacitance available to absorb current from a discharge. Power clamp circuits, such as a shunt circuit, may be used to provide ESD protection. A shunt circuit responds to a rapid rise of voltage on a power supply line, sometimes referred to as an ESD upset event, by shunting a power supply line to ground. Alternatively, protection diodes coupled to the positive and negative power supplies on an integrated circuit may be used for ESD protection, as desired.

It is possible to distinguish between an ESD upset event and a normal application of power by a difference in rise time. For instance, in a state of the art integrated circuit a rise time on a power supply line may be on the order of nanoseconds (ns) for an ESD upset event, whereas a rise time during regular application of power to the supply line may be on the order of microseconds (μs). Therefore, there may be an order of magnitude difference between an ESD upset event and regular application rise time.

In some instances during normal operation when several outputs switch simultaneously, it is possible that a voltage drop due to noise, such as an IR or RLC voltage drop, on a power supply line can be substantially similar to an ESD upset event rise time range triggering erroneous or false protection. A false trigger during normal operation is undesirable and may damage the integrated circuit or the system in which it is used.

SUMMARY

A technique that minimizes false triggering of an electrostatic discharge (ESD) protection circuit is disclosed. In an embodiment, the resistor-capacitor (RC) time constant of an ESD trigger element is reduced during normal operation minimizing the risk of false triggering. Circuit layout area is saved without the need of a timeout circuit associated with releasing a device maintaining a trigger state (i.e., a trigger latch). A RC time constant for triggering is set in an operational context according to conditions of usage and desired application of the ESD protection circuit.

BRIEF DESCRIPTION OF THE DRAWINGS

A more detailed understanding of the invention may be had from the following description, given by way of example and to be understood in conjunction with the accompanying drawings wherein.

DETAILED DESCRIPTION OF EXAMPLE EMBODIMENTS

The invention will be described with reference to the figures wherein like numerals represent like elements throughout. For purposes of describing embodiments of the invention, various examples of timing rates are given below. It is noted that these examples are provided in view of the current state of the art. As integrated circuit feature sizes decrease, timing rates, rise, and fall times will scale accordingly. Therefore, these examples are not limiting and future advances are encompassed in the scope of embodiments of the invention.

Embodiments of the invention provide electrostatic discharge (ESD) protection that are applicable in at least the following exemplary scenarios:

(a.) For a given circuit the supply voltage is approximately 0 Volts (i.e., integrated circuit (IC) is off). Here, embodiments of the invention are responsive to supply voltage variations $$\frac{dV}{dt}$$

in the range to those produced by ESD. The ESD events may occur during testing, manual handling of the IC, IC transportation (i.e., manufacturing line), and manufacturing processes (assembly, packaging, etc.).

(b.) During device power up where $$\frac{dV}{dt}$$

is in the range of an ESD event. Some embodiments of the invention operate when $$\frac{dV}{dt}$$

is on the order of 2-3V/100 ns or slower depending on the fabrication processing technology and, as such, is generally lower than $$\frac{dV}{dt}$$

produced by the ESD event.

(c.) When $V_{DD}$ does not start from 0 Volts (i.e., IC is powered on). Here, embodiments of the invention enable the circuit to be immune to triggering that could be caused by simultaneously switching outputs (SSO) generating noise or other types of noise. The circuit is protected even when disturbances are in the range of those produced by ESD events.

ESD Protection Apparatus

Figure 1:
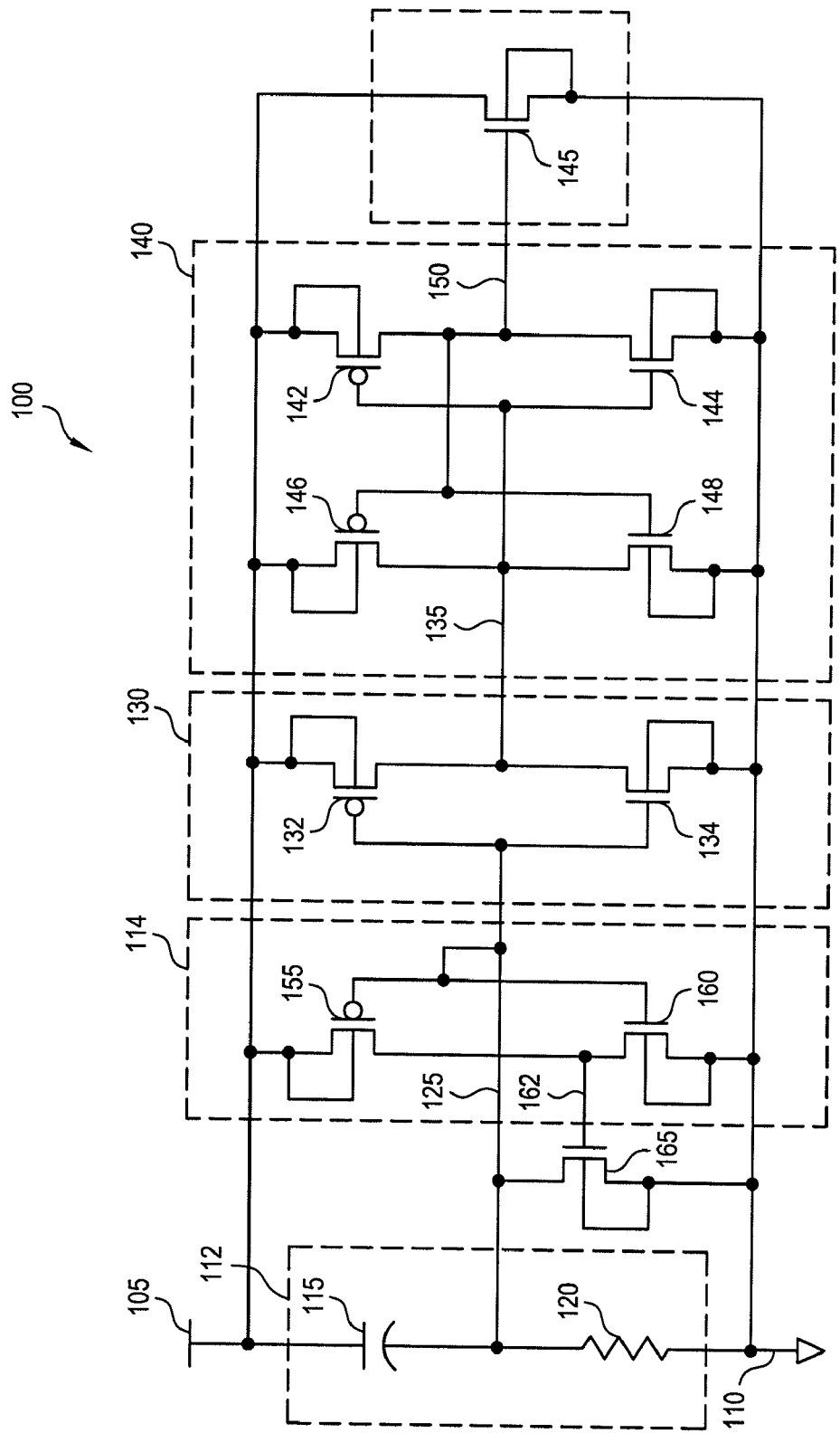
FIG. 1 is an illustration of an apparatus for providing ESD protection in accordance with an embodiment of the present invention.

FIG. 1 is an illustration of an apparatus 100 for providing ESD protection. A desired operation of apparatus 100 is to provide protection against ESD events in a non-powered device and to be transparent to electrical activity with similar characteristics to an ESD event when the device is powered. A non-powered situation, for example, may be when the device containing the ESD protection apparatus 100 is being transported (i.e., manufacturing chain or manually handled) or is involved in manufacturing processes (i.e., assembly or packaging). A transparent situation, for example, may be during powered-on operation where either an ESD risk does not exist or large decoupling capacitances are generally available at a system level (i.e., outside of the integrated circuit) to shield an associated device, such as another integrated circuit or system, in normal operation.

Trigger stage 112 provides a trigger voltage on ESD trigger node 125 to activate ESD inverter 130 based on the RC time constant produced by the values of trigger capacitor 115 in series with trigger resistor 120. The RC time constant may be chosen based on an expected response time to ESD upset events, for example 10 nanoseconds. Inverter 114 controls the operation of trigger shunt device 165 that shunts trigger resistor 120, as needed, depending on the value of the trigger voltage on node 125. ESD inverter 130 controls the logic for latching trigger latch 140 that in turn controls ESD shunt device 145 to protect an associated circuit during an ESD event as needed.

Trigger stage 112 is provided by a series coupling of trigger capacitor 115 and trigger resistor 120 that are coupled between $V_{DD}$ 105 and ground 110. Inverter 114 is coupled to ESD inverter 130 and trigger latch 140 that are each coupled between $V_{DD}$ 105 and ground 110. ESD trigger node 125 provides a coupling between an output of trigger stage 112 to an input of inverter 114 and ESD inverter 130. ESD inverter 130 comprises an inverter pullup device 132 in series with an inverter pulldown device 134 coupled between $V_{DD}$ 105 and ground 110. The input of ESD inverter 130 is coupled to a control input of both the inverter pullup device 132 and the inverter pulldown device 134. A trigger node 135 provides a coupling between an output of ESD inverter 130 and an input of trigger latch 140. An ESD shunt device 145 is coupled between $V_{DD}$ 105 and ground 110. An ESD shunt trigger node 150 provides a coupling between an output of trigger latch 140 and an input of an ESD shunt device 145.

The trigger latch stage 140 comprises a first latch pullup device 142 in series with a first latch pulldown device 144 between $V_{DD}$ 105 and ground 110. Trigger latch 140 also comprises a second latch pullup device 146 in series with a second latch pulldown device 148 between $V_{DD}$ 105 and ground 110. The trigger node 135 couples a control input of each of the first latch pullup device 142 and the first latch pulldown device 144 as well as the series connection node of the second latch pullup device 146 and the second latch pulldown device 148. ESD shunt trigger node 150 couples a control input of each of the second latch pullup device 146 and the second latch pulldown device 148 as well as a series coupling node of the first latch pullup device 142 and the first latch pulldown device 144.

Inverter 114 is comprised of pullup device 155 and pulldown device 160 configured to provide a very low switching threshold voltage level for controlling trigger shunt device 165. Trigger shunt device 165 is coupled between the ESD trigger node 125 and ground 110 thus providing a shunt for trigger resistor 120. Pullup device 155 and pulldown device 160 provide an efficient way to control trigger shunt device 165 as they do not occupy as much circuit layout space in comparison to other resistor-capacitor (RC) implementations, allowing more space for the other devices on ESD protection apparatus 100. For example, assuming a 0.18 μm complementary-symmetry metal-oxide-semiconductor (CMOS) technology pullup device 155 and pulldown device 160 may occupy less than 2% of the space required for using a resistor-capacitor layout. Inverter 114 may occupy an area of 27 μm² versus 1400 μm² for a resistor-capacitor layout controlling trigger shunt device 165.

For scenario (a.) in paragraph [0019] above, voltage on $V_{DD}$ 105 increases rapidly. It is desirable to have the ESD shunt device 145 triggered and maintained in a triggered state for the duration of the ESD event. Within the ESD event a rate of voltage change per unit time, or $$\frac{dV}{dt},$$

is high. In the current state of the art, an ESD event duration may be on the order of 1 μs; but the onset of the ESD event is a fraction of the duration and ranges on the order of, for example, 10 ns, depending on the intrinsic or parasitic capacitances within an integrated circuit. Current through trigger capacitor 115 is given by $$i_{TC} = C_T \frac{dV}{dt}$$

where $C_T$ is a value of trigger capacitor 115. $C_T$ is typically 1 pF. A high rate of $$\frac{dV}{dt}$$

means that sufficient current ($i_{TC}$) is provided through trigger capacitor 115 and to trigger resistor 120 to provide a trigger voltage (not shown) on the ESD trigger node 125 sufficient to activate ESD inverter 130. For example, in a process implementation with a source voltage of about 1 V, 0.3-0.5 V would be sufficient to activate ESD inverter 130.

Inverter 114 has a very low switching threshold level compared to ESD inverter 130 (e.g., 0.1V with a source voltage of 1V) assuring that trigger shunt device 165 has its gate at node 162 at a low logic level or in an off state during an onset of an ESD event. With a very low switching threshold level, during the onset of an ESD event a small voltage on ESD trigger node 125 is seen as a high logic level leading the output of the inverter at node 162 to drive a low logic level preventing triggering of trigger shunt device 165. In this way, the values of trigger capacitor 115 in series with trigger resistor 120 determine the first RC time constant during the onset of the ESD event. In other words, the resistance of trigger shunt device 165 is not in parallel with the trigger resistor 120 during the onset of the ESD event.

With the ESD event producing sufficient current through trigger capacitor 115, the resulting trigger voltage on the ESD trigger node 125 produces a low voltage on trigger node 135 at an output of the ESD inverter 130. Voltage from the ESD event, applied to $V_{DD}$ 105, is sufficient to support logic operation of ESD inverter 130 and trigger latch 140 circuit elements during the upset event. For example, if typical power supply voltage level is 3 Volts (V), an ESD event occurring to a non-powered device will easily generate several volts and therefore will supply an operating voltage for ESD inverter 130 and trigger latch 140 circuit elements. A low voltage on trigger node 135 sets trigger latch 140 and produces a high voltage level on ESD shunt trigger node 150. A high voltage level on ESD shunt trigger node 150 turns on ESD shunt device 145 causing $V_{DD}$ 105 to be shunted to ground 110. The integrated circuit associated with ESD protection apparatus 100 is protected by a conductive path, through the ESD shunt device 145, from damage due to high voltage produced by the current of the ESD event.

After the current produced by the ESD event stops rising (typically 10 ns for a Human Body Model ESD event), the voltage level on $V_{DD}$ node 105 starts to decrease due to the conduction path produced by ESD shunt transistor 145. ESD trigger node 125 is discharged to ground, first slowly across trigger resistor 120. When the potential on ESD trigger node 125 becomes sufficiently low (compared to the voltage remaining on $V_{DD}$ node 105) inverter 114 switches turning on shunt transistor 165. ESD trigger node 125 is discharged more quickly across the parallel combination of the trigger resistor 120 and the resistance of trigger shunt device 165. A low-level voltage is produced on ESD trigger node 125.

The low-level voltage on ESD trigger node 125 does not produce a high-level voltage on trigger node 135 at the output of ESD inverter 130. The low-level voltage on ESD trigger node 125 activates the inverter pullup device 132 that tries to pullup trigger node 135. The inverter pullup device 132 is overpowered by the second latch pulldown device 148. A control input gate of the second latch pulldown device 148 is supplied by a high-level logic signal on the ESD shunt trigger node 150 due to the previous triggering of trigger latch 140. With the second latch pulldown device 148 active, a low-level voltage on the trigger node 135 is maintained.

The transistor devices in ESD inverter 130 and trigger latch 140 are designed with device dimensions that produce asymmetrical current gains in certain pullup devices compared to certain pulldown devices. Current gains designed in this way cause a switching threshold of trigger latch 140 to favor the triggered state and not allow ESD inverter 130 to reset trigger latch 140. For example, the device geometries of the second latch pulldown device 148 produce a greater current gain than the current gain produced by the device geometries of the inverter pullup device 132. In this way, the onset of a low-voltage level on ESD trigger node 125 is kept from resetting trigger latch 140, producing a low level voltage on the ESD shunt trigger node 150, and turning off ESD shunt device 145. Once triggered by the onset of an ESD event, trigger latch 140 remains set producing a high level voltage on the ESD shunt trigger node 150 and maintains ESD protection through ESD shunt device 145.

For scenario (b.) in paragraph [0019] above, a circuit associated with the ESD protection apparatus 100 is powering up. The ramp-up voltage on $V_{DD}$ 105 is at a slower rate (i.e., a lower $$\frac{dV}{dt},$$

such as on the order of 100 ns) than an ESD event and is consequently not detected by the trigger capacitor 115 and trigger resistor 120 elements that produce the first RC time constant. No trigger voltage is developed on the ESD trigger node 125 and no shunting through ESD shunt device 145 occurs.

For scenario (c.) in paragraph [0019] above, where an integrated circuit associated with the ESD protection apparatus 100 is powered up and in normal operation, it is desirable that the ESD shunt device 145 not be triggered in the event of voltage fluctuations on $V_{DD}$ 105 due to, for example, SSO or other noise. With the ESD protection apparatus 100 powered up, the combination of pullup device 155 and pulldown device 160 provide a high-level-voltage bias to the control input of trigger shunt device 165. The high-voltage level on the control input turns on trigger shunt device 165 and shunts ESD trigger node 125 and trigger resistor 120 to ground 110. A resistance of trigger shunt device 165 is in parallel with trigger resistor 120 and thus forms a second RC time constant.

In the case of a voltage fluctuation on $V_{DD}$ 105 due to SSO or noise occurring to the powered circuit associated with the ESD protection apparatus 100, voltage on $V_{DD}$ 105 varies about the nominal value with both positive and negative excursions in voltage. A $$\frac{dV}{dt}$$

rate of change for the positive voltage fluctuations may be on the order of 10 ns. This rate of $$\frac{dV}{dt}$$

means that insufficient current ($i_{TC}$) is provided through trigger capacitor 115 to the parallel combination of trigger resistor 120 and resistance of trigger shunt device 165 to provide a trigger voltage on ESD trigger node 125. Consequently, ESD inverter 130 is not activated when the device is powered and an SSO event occurs.

With values of trigger capacitor 115 and trigger resistor 120 selected to produce the first RC time constant (for an appropriate response to an expected ESD upset event) and channel width versus channel length (W/L) values of pullup device 155 and pulldown device 160 selected to produce a very low switching threshold level, ESD protection apparatus 100 is triggered appropriately to protect an associated integrated circuit. Additionally, the protective shunting state of ESD protection apparatus 100 is achieved without additional release circuitry and without any additional circuit area that the release circuitry would require if incorporated.

Signal Waveforms for Providing ESD Protection

Figure 2:
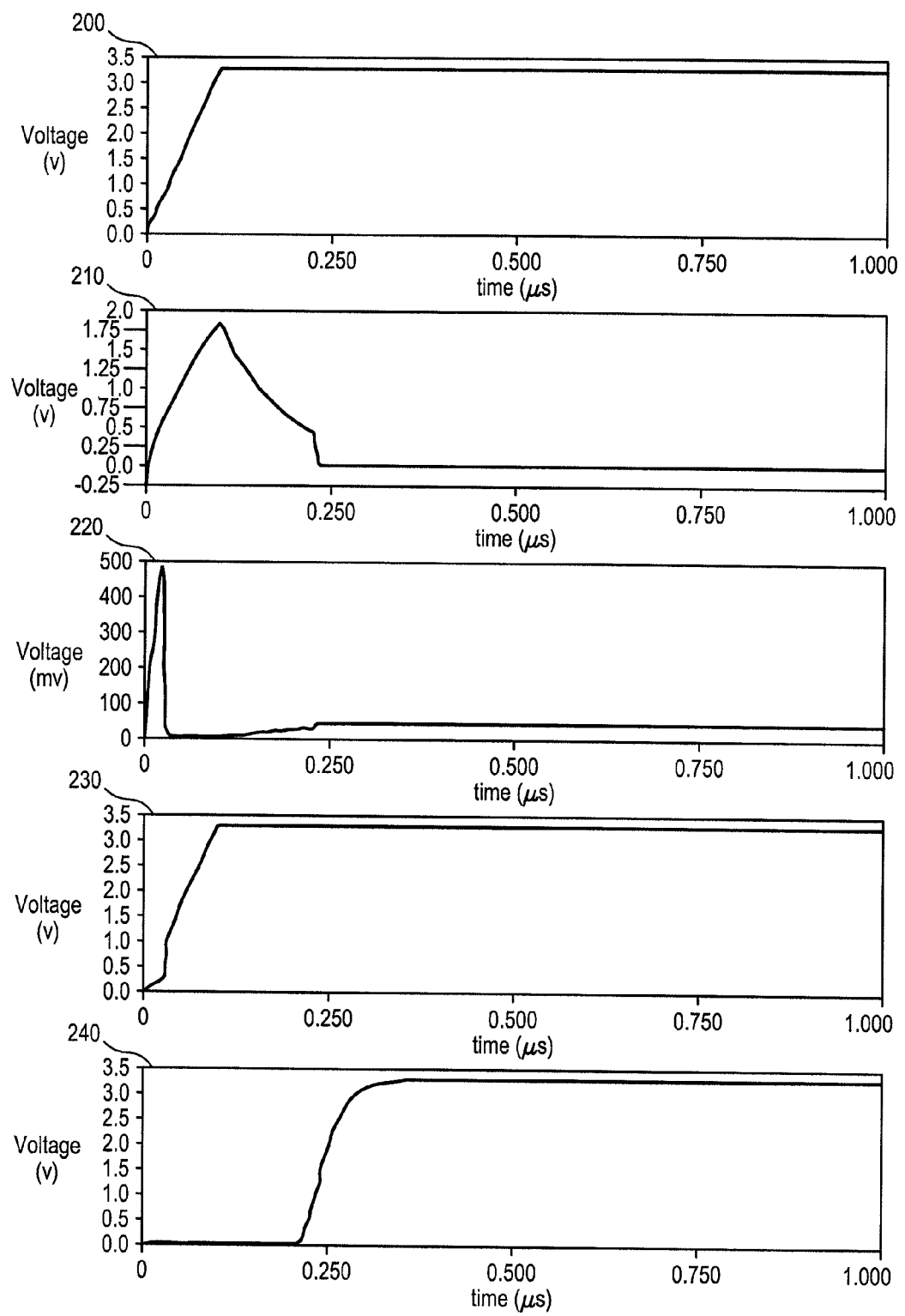
FIG. 2 is an illustration of signal waveforms describing the operation of the ESD protection apparatus during a power-up ESD upset event in accordance with an embodiment of the present invention.

FIG. 2 is an illustration of signal waveforms describing the operation of ESD protection apparatus 100 during a power-up ESD upset event. In response to $V_{DD}$ node 105 ramping up (200), ESD trigger node 125 rises quickly (210). This initiates ESD protection apparatus 100 to trigger by providing a high logic level to ESD shunt trigger node 150 (230). With very low threshold voltage levels of pullup device 155 and pulldown device 160 and a high logic level at ESD trigger node 125 relative to $V_{DD}$, trigger shunt device 165 is kept off by providing a low logic level to node 162 (240). Keeping trigger shunt device 165 off allows the voltage level on ESD trigger node 125 to rise during the rising edge of $V_{DD}$ node 105 beyond the threshold voltage levels of ESD inverter 130 causing it to switch and provide a low logic level to trigger node 135 (220).

The low logic voltage level on trigger node 135 allows switching of first latch pullup device 142 and first latch pulldown device 144 leading to a high logic level on ESD shunt trigger node 150 triggering a clamp. Second latch pullup device 146 and second latch pulldown device 148 maintain trigger node 135 and ESD shunt trigger node 150 to a low and high logic level, respectively, regardless of the voltage on ESD trigger node 125 while $V_{DD}$ is present.

Once $V_{DD}$ node 105 stops rising, ESD trigger node 125 decreases slowly due to the high resistance of trigger resistor 120 and trigger shunt device 165 remaining off. Subsequent to ESD trigger node 125 reaching low voltage threshold levels of pullup device 155 and pulldown device 160, inverter 114 switches providing a high voltage level to trigger shunt device 165. As a result, the voltage on ESD trigger node 125 begins to decrease at a faster rate due to a low resistance of trigger shunt device 165 in parallel with trigger resistor 120. It is desirable to avoid trigger shunt device 165 from turning on while $V_{DD}$ is rising (in the range of the onset of an ESD event) in order to have the highest RC detection capabilities. This is achieved by pullup device 155 and pulldown device 160 having very low threshold voltage levels.

ESD Protection Method

Figure 3:
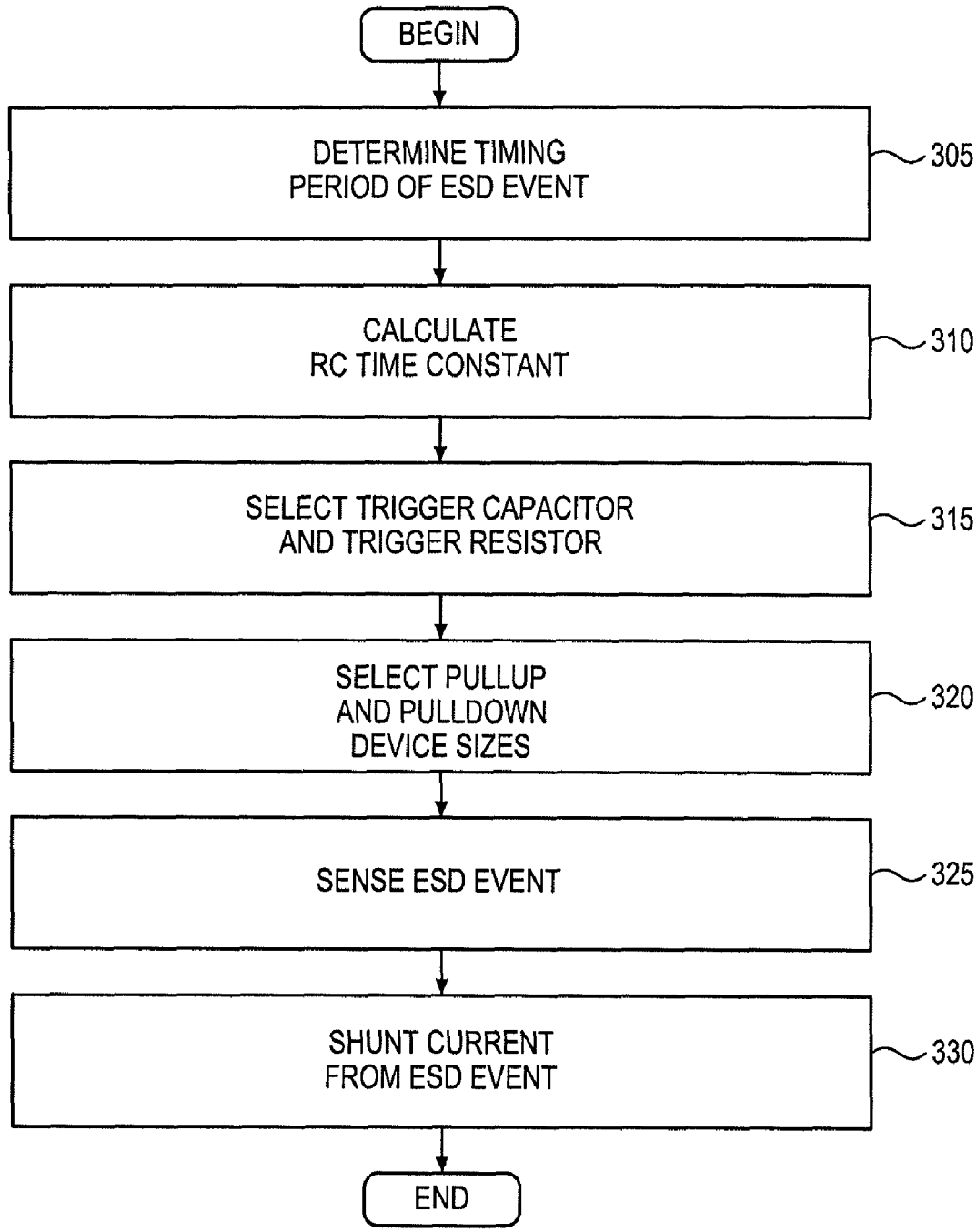
FIG. 3 is a method for providing ESD protection in accordance with an embodiment of the present invention.

FIG. 3 is a method for providing ESD protection. In step 305, a time period is determined encompassing a time range of an expected ESD event. In step 310, a RC time constant corresponding to the time period is calculated. In step 315, a trigger capacitor 115 having a particular capacitance and a trigger resistor 120 having a particular resistance are selected to produce the RC time constant. For example, in a present day semiconductor fabrication process, with a standard human body model set of parameters of 5000 volts, 100 picofarads for capacitor 115, and 1500 ohms for resistor 120, an expected range of the response time required for the RC time constant would be on the order of 10 nanoseconds.

In step 320, inverter 114 comprising a pullup device 155 having a particular size and a pulldown device 160 having a particular size are selected to produce a very low switching threshold compared to ESD inverter 130 (e.g. 0.1V with a source voltage of 1V) assuring that trigger shunt device 165 has its gate at node 162 at a low logic level or in an off state during an onset of an ESD event. However, as explained above inverter 114 shunts resistor 120 by turning on device 165 when an associate circuit is powered (i.e. scenario (c.)) preventing false triggering caused by simultaneously switching outputs (SSO).

In step 325, an ESD event having an onset timeframe corresponding to the time period is sensed by trigger stage 112. In step 330, a shunting current in stage 112 is produced by the ESD event causing stages 130 and 140 to respond to trigger a shunt by ESD shunt device 145. In the process shown in FIG. 3, an ESD event is appropriately recognized and responded to including providing for the shunting of ESD induced current of the potentially harmful event.

Although the features and elements of the present invention are described in the example embodiments in particular combinations, each feature or element can be used alone without the other features and elements of the example embodiments or in various combinations with or without other features and elements of the present invention. Embodiments of the invention, both apparatus and process, may be implemented in a computer program or firmware tangibly embodied in a computer-readable storage medium having machine readable instructions for execution by a machine, a processor, and/or any general purpose computer for use with or by any non-volatile memory device. Suitable processors include, by way of example, both general and special purpose processors.

Typically, a processor will receive instructions and data from a read only memory (ROM), a RAM, and/or a storage device having stored software or firmware. Storage devices suitable for embodying computer program instructions and data include all forms of non-volatile memory, including by way of example semiconductor memory devices, read only memories (ROMs), magnetic media such as internal hard disks and removable disks, magneto-optical media, and optical media such as CD-ROM disks and digital versatile disks (DVDs). Types of hardware components, processors, or machines which may be used by or in conjunction with the present invention include Application Specific Integrated Circuits (ASICs), Field Programmable Gate Arrays (FPGAs), microprocessors, or any integrated circuit.

What is claimed is:

1. An apparatus for providing electrostatic discharge (ESD) protection, the apparatus comprising:
    a trigger stage having a trigger capacitor coupled to a trigger resistor, the trigger stage being coupled to a first inverter, the first inverter configured to control only a trigger shunt device;
    the trigger stage being configured to respond to an ESD event; and
    a second inverter coupled to the trigger stage and the first inverter, and to a trigger latch to control an ESD shunt device; and
    wherein the trigger shunt device shunts the trigger resistor when an associated device coupled to the apparatus is powered.

2. The apparatus of claim 1, wherein an RC time constant of the apparatus is substantially reduced by the trigger shunt device configured to shunt the trigger resistor.

3. The apparatus of claim 2, wherein the RC time constant of the apparatus is configured to be substantially less than an expected rate of voltage fluctuation on a power terminal due to noise or simultaneous switching outputs produced by the associated device, the apparatus being responsive to the noise or simultaneous switching of outputs when the associated device is off.

4. The apparatus of claim 1, wherein the trigger latch is configured to retain an indication of an ESD event being triggered.

5. The apparatus of claim 1 being configured to have an RC time constant selected to correspond with an expected time range of an ESD event.

6. The apparatus of claim 1, wherein values of the trigger capacitor and the trigger resistor determine a predetermined RC time constant that corresponds with voltage characteristics related to an onset of an ESD event during a non-powered condition.

7. An apparatus comprising:
    a capacitor and a resistor coupled in series between a power node and a ground node;
    a first inverter having an input coupled to a node between the capacitor and the resistor;
    a trigger shunt device having a gate coupled to an output of the first inverter, a drain coupled to the input of the first inverter, a source coupled to the ground node, and a region between the drain and the source coupled to the ground node, where the first inverter is configured to control only the trigger shunt device;

a second inverter having an input coupled to the input of the first inverter;

a latch coupled to an output of the second inverter; and an electrostatic discharge shunt device coupled to the latch and coupled between the power node and the ground node.

8. The apparatus of claim 7, wherein the trigger shunt device and the electrostatic discharge shunt device include a same type of transistors.

9. The apparatus of claim 7, wherein the electrostatic discharge shunt device includes a gate coupled to the latch, a drain coupled to the power node, a source coupled to the ground node, and a region between the drain and the source coupled to the ground node.

10. The apparatus of claim 7, wherein the first inverter includes a first transistor and a second transistor coupled in series between the power node and the ground node, the second transistor including a gate coupled to the input of the second inverter, a drain coupled to the gate of the trigger shunt device, a source coupled to the ground node, and a region between the drain and the source coupled to the ground node.

11. The apparatus of claim 7, wherein the second inverter includes a third transistor and a fourth transistor coupled in series between the power node and the ground node, the fourth transistor including a gate coupled to the input of the first inverter, a drain coupled to the output of the second inverter, a source coupled to the ground node, and a region between the drain and the source coupled to the ground node.

12. The apparatus of claim 7, wherein the latch includes a third inverter coupled between the power node and the ground node, a fourth inverter coupled between the power node and the ground node, the fourth inverter having an input coupled to an output of the third inverter and an output coupled to an input of the third inverter and to the gate of the electrostatic discharge shunt device.

* * * * *